United States Patent
Givens

(10) Patent No.: US 8,014,517 B2
(45) Date of Patent: Sep. 6, 2011

(54) METHOD AND APPARATUS FOR ENHANCED CONVERGENCE OF THE NORMALIZED LMS ALGORITHM

(75) Inventor: Maurice Givens, Chicago, IL (US)

(73) Assignee: Gas Technology Institute, Des Plaines, IL (US)

( * ) Notice: Subject to any disclaimer, the term of this patent is extended or adjusted under 35 U.S.C. 154(b) by 1175 days.

(21) Appl. No.: 11/787,858

(22) Filed: Apr. 18, 2007

(65) Prior Publication Data

US 2008/0260141 A1    Oct. 23, 2008

(51) Int. Cl.
*H04M 9/08* (2006.01)

(52) U.S. Cl. .............................. 379/406.09; 379/406.02

(58) Field of Classification Search . 379/406.01–406.16
See application file for complete search history.

(56) References Cited

U.S. PATENT DOCUMENTS

| | | | |
|---|---|---|---|
| 4,939,685 A | 7/1990 | Feintuch | |
| 4,989,170 A | 1/1991 | Batruni et al. | |
| 6,031,908 A | 2/2000 | Laberteaux et al. | |
| 6,185,300 B1 | 2/2001 | Romesburg | |
| 6,240,180 B1 | 5/2001 | Younce et al. | |
| 6,570,985 B1 | 5/2003 | Romesburg | |
| 6,614,907 B1 | 9/2003 | Laberteaux et al. | |
| 6,718,035 B2 | 4/2004 | Younce et al. | |
| 6,757,702 B1 | 6/2004 | Lin et al. | |
| 2001/0016041 A1* | 8/2001 | Younce et al. | 379/406.01 |

OTHER PUBLICATIONS

Harris, Richard W. et al., A Variable Step (VS) Adaptive Filter Algorithm, IEEE Transactions on Acoustics, Speech, and Signal Processing, vol. ASSP-34, No. 2, Apr. 1986, pp. 309-315.*

Harris et al., A Variable Step (VS) Adaptive Filter Algorithm, IEEE Transactions on Acoustics, Speech, and Signal Processing, vol. ASSP-34, No. 2, Apr. 1986, pp. 309-315.*

Harris, Richard W. et al., "A Variable Step (VS) Adaptive Filter Algorithm", IEEE Transactions on Acoustics, Speech, and Signal Processing, vol. ASSP-34, No. 2, Apr. 1986, pp. 309-315.

Aboulnasr, Tyseer et al., "A Robust Variable Step-Size LMS-Type Algorithm: Analysis and Simulations", IEEE Transactions on Signal Processing, vol. 45, No. 3, Mar. 1997, pp. 631-639.

Pazaitis, Dimitrios I. Et al., "A Novel Kurtosis Driven Variable Step-Size Adaptive Algorithm", IEEE Transactions on Signal Processing, vol. 47, No. 3, Mar. 1999, pp. 864-872.

Evans, Joseph B. et al., "Analysis and Implementation of Variable Step Size Adaptive Algorithms", IEEE Transactions on Signal Processing, vol. 41, No. 8, Aug. 1993, pp. 2517-2535.

Kwong, Raymond H. et al., "A Variable Step Size LMS Algorithm", IEEE Transactions on Signal Processing, vol. 40, No. 7, Jul. 1992, pp. 1633-1642.

Gelfand, Saul B. et al., "The Stability of Variable Step-Size LMS Algorithms", IEEE Transactions on Signal Processing, vol. 47, No. 12, Dec. 1999, pp. 3277-3288.

Diniz, Paulo S.R. et al., "Analysis of LMS-Newton Adaptive Filtering Algorithms with Variable Convergence Factor", IEEE Transactions on Signal Processing, vol. 43, No. 3, Mar. 1995, pp. 617-627.

Soo, Jia-Sien et al., "A Multistep Size (MSS) Frequency Domain Adaptive Filter", IEEE Transactions on Signal Processing, vol. 39, No. 1, Jan. 1991, pp. 115-121.

Haweel, Tarek I. Et al., "A Class of Order Statistic LMS Algorithms", IEEE Transactions on Signal Processing, vol. 40, No. 1, Jan. 1992, pp. 44-53.

* cited by examiner

*Primary Examiner* — Fan Tsang
*Assistant Examiner* — Ibraham Sharifzada
(74) *Attorney, Agent, or Firm* — Mark E. Fejer

(57) ABSTRACT

Adaptive filters employing a normalized time domain least mean square algorithm having enhanced convergence rates by virtue of the use of an update gain greater than $$\frac{2}{\lambda_{max}} \text{ or } \frac{2}{3\,tr[R]}.$$

6 Claims, 6 Drawing Sheets

METHOD AND APPARATUS FOR ENHANCED CONVERGENCE OF THE NORMALIZED LMS ALGORITHM

BACKGROUND OF THE INVENTION

1. Field of the Invention

This invention relates to adaptive filters employing a normalized time domain least mean square (LMS) algorithm for applications where the statistics of the input processes are unknown or changing including noise cancellation, line enhancing, and adaptive array processing. More particularly, this invention relates to adaptive filters employing a normalized time domain least mean square algorithm having enhanced convergence rates by virtue of the use of an update gain greater than that accepted in the art as being an upper bound.

2. Description of Related Art

FIG. 1 shows a block diagram of a classic system identification adaptive filter configuration. The objective of an adaptive filter 10 is to change, or adapt, the coefficients of the filter to match as closely as possible the response of an unknown system 11. The unknown system and the adaptive filter process the same input signal x(k) and have outputs y(k), the desired signal, and y'(k). The adaptive filter 10 is adapted using a normalized time domain least mean square algorithm. First, the error signal, e(k), which is the difference between the output y'(k) of the adaptive filter and the output y(k) of the unknown system is computed. Using the calculated error as a basis, the adaptive filter changes its coefficients in an attempt to reduce the error.

In much of the research of the least mean square algorithm, the update gain has been referred to as variable step-size (See Harris, Richard W. et al., "A Variable Step (VS) Adaptive Filter Algorithm", *IEEE Trans. Acoust. Speech. Signal Processing*, vol. ASSP-34, pp. 309-316, April 1986; Aboulnasr, Tyseer et al., "A Robust Variable Step-Size LMS-Type Algortihm: Analysis and Simulations", *IEEE Trans. Signal Processing*, vol. 45, pp. 631-639, March 1997; Pazaitis, Dimitrios I. et al., "A Novel Kurtosis Driven Variable Step-Size Adaptive Algorithm", *IEEE Trans. Signal Processing*, vol. 47, pp 864-872, March 1999; Evans, Joseph B. et al., "Analysis and Implementation of Variable Step Size Adaptive Algorithms", *IEEE Trans. Signal Processing*, vol. 41, pp. 2517-2535, August 1993; Kwong, Raymond H. et al., "A Variable Step Size LMS Algorithm", *IEEE Trans. Signal Processing*, vol. 40, pp 1633-1642, July 1992; Gelfand, Saul B. et al., "The Stability of Variable Step-Size LMS Algorithms", *IEEE Trans. Signal Processing*, vol. 47, pp. 3277-3288, December 1999.); variable convergence rate (See Diniz, Paulo S. R. et al., "Analysis of LMS-Newton Adaptive Filtering Algorithms with Variable Convergence Factor", *IEEE Trans. Signal Processing*, vol. 43, pp. 617-627, March 1995); and even multistep size (See Soo, Jia-Sien et al., "A Multistep Size (MSS) Frequency Domain Adaptive Filter", *IEEE Trans. Signal Processing*, vol. 39, pp. 115-121, January 1991). These terms are not quite accurate.

Most of the research does not differentiate between a variable update gain and a non-uniform update gain. The scalar form of the LMS is well known as $$h(x+1) = h(k) + \mu e(k) x(k)$$

with µ equal to scalar update gain, e(k) the error at time k, and $x(k) = [x(k), x(k-1), \ldots, x(k-N+1)]^T$ is an N-dimensional column vector at time k. The scalar value for µ results in a constant, uniform update gain. Thus, the gain, µ, can be replaced with the matrix $$M = \begin{bmatrix} \mu & & 0 \\ & \ddots & \\ 0 & & \mu \end{bmatrix}$$

resulting in a LMS algorithm $$h(x+1) = h(k) + Me(k) x(k)$$

In this case, the update gain is constant and uniform across all coefficients of the vector h(k).

An example of a variable step size with uniform update gain is the normalized LMS algorithm (NLMS)

$$h(k+1) = h(k) + \frac{\mu e(k) x(k)}{x^T(k) x(k)}$$

The effective update gain is $$\frac{\mu}{x^T(k) x(k)}$$

and varies with $\sigma_x^2$, the variance of the input. Although the step size is variable, the update gain is still uniform across all coefficients of h.

In some research, the update gain matrix M has been replaced by $$M = \begin{bmatrix} \mu_1 & & 0 \\ & \ddots & \\ 0 & & \mu_N \end{bmatrix}$$

with each $\mu_i$ not necessarily equal to form a non-uniform gain matrix. Publications of some performance characteristics for this form state the upper bound for $\mu_i$ of M generally as $$\mu_i \leq \frac{2}{\lambda_{max}}$$

or $$\mu_i \leq \frac{2}{3 tr[R]}$$

While these are upper bounds, they are generally not good upper bounds. Improvements in convergence speed for the NLMS algorithm has been sought by a number of researchers. However, the researchers have generally been limited by the criterion that the maximum limit for the update gain is as specified above.

SUMMARY OF THE INVENTION

It is, thus, one object of this invention to provide a method for increasing the convergence rate of a normalized LMS algorithm.

It is another object of the invention to provide a method for increasing the convergence rate of the normalized LMS algorithm without causing instability in the algorithm.

These and other objects of this invention are addressed by an adaptive filtering method comprising the steps of computing a difference between an adaptive filter output signal of an adaptive filter having a plurality of filter coefficients and an unknown system output signal, which difference constitutes an error signal, and adjusting the filter coefficients using a normalized LMS algorithm employing an update gain greater than $$\frac{2}{\lambda_{max}} \text{ or } \frac{2}{3 tr[R]}$$

so as to reduce the error signal.

BRIEF DESCRIPTION OF THE DRAWINGS

These and other objects and features of this invention will be better understood from the following detailed description taken in conjunction with the drawings, wherein.

DETAILED DESCRIPTION OF THE PRESENTLY PREFERRED EMBODIMENTS

The invention disclosed herein is an adaptive filtering method for reducing an error signal, which method employs a normalized LMS algorithm with an update gain greater than the well-accepted limits of $$\frac{2}{\lambda_{max}} \text{ or } \frac{2}{3 tr[R]}.$$

Such update gains are achieved by limiting the sum of $\mu_i$ of the matrix M, i.e.

$$\sum_{i=1}^{N} \mu_i,$$

to the number of coefficients in the adaptive filter. Thus, for example, if the adaptive filter has 256 coefficients, then $$\sum_{i=1}^{N} \mu_i = 256.$$

Subject to this limitation, this invention increases the update gain for those coefficients that are active during convergence. For coefficients which are not active during convergence, the value assigned to them is substantially zero.

The invention disclosed herein is not limited to the diagonal form of the matrix shown herein above. It is also applicable to the general case where the matrix takes the form $$M = \begin{bmatrix} \mu_{1,1} & \cdots & \mu_{1,N} \\ & \vdots & \\ \mu_{N,1} & \cdots & \mu_{N,N} \end{bmatrix}$$

where each $\mu_{i,j}$ can be chosen independently.

EXAMPLE

Figure 1:
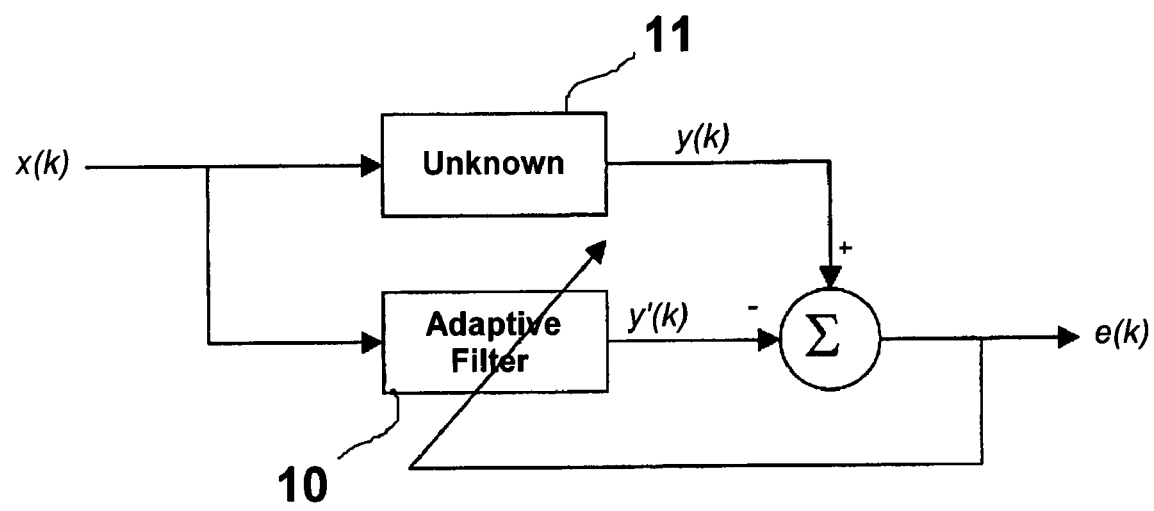
FIG. 1 is a diagram of a conventional adaptive filter configuration.
Figure 2:
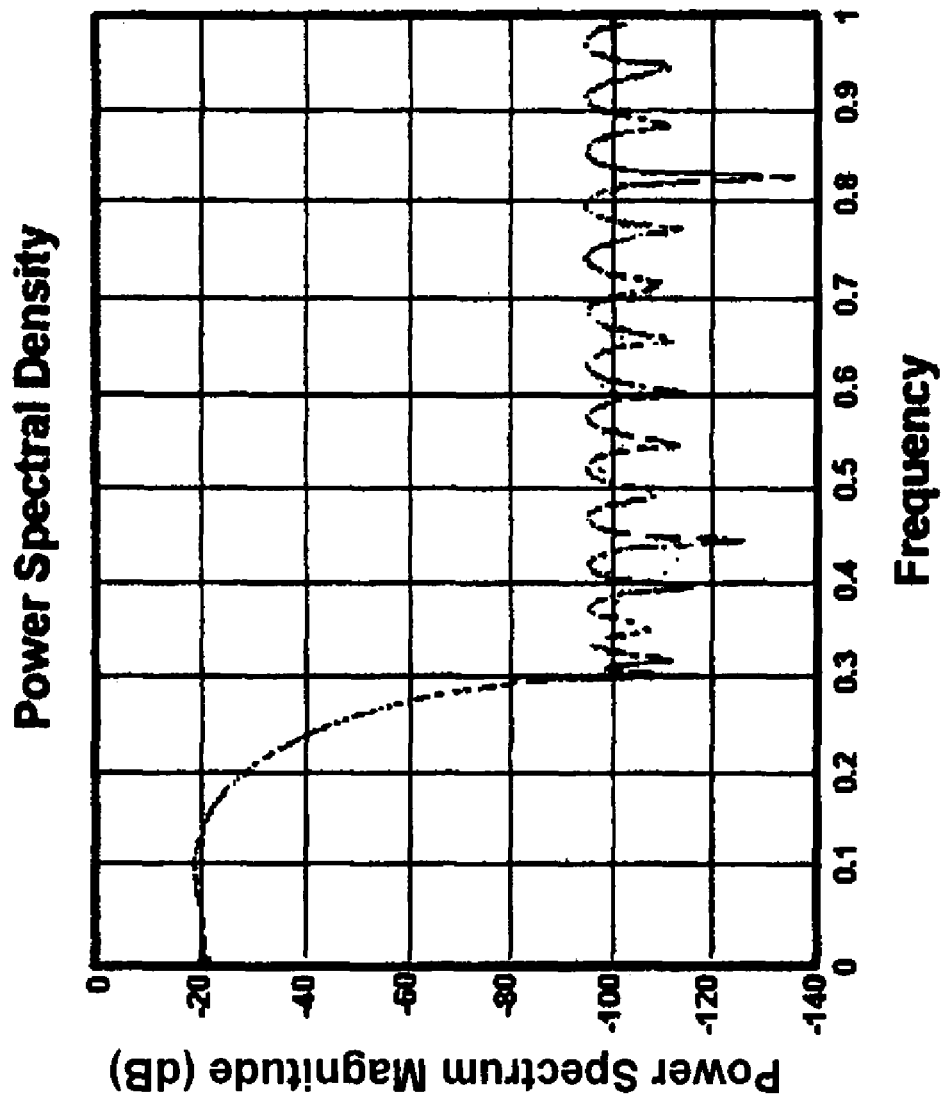
FIG. 2 is a diagram showing power spectral density for an unknown system.
Figure 3:
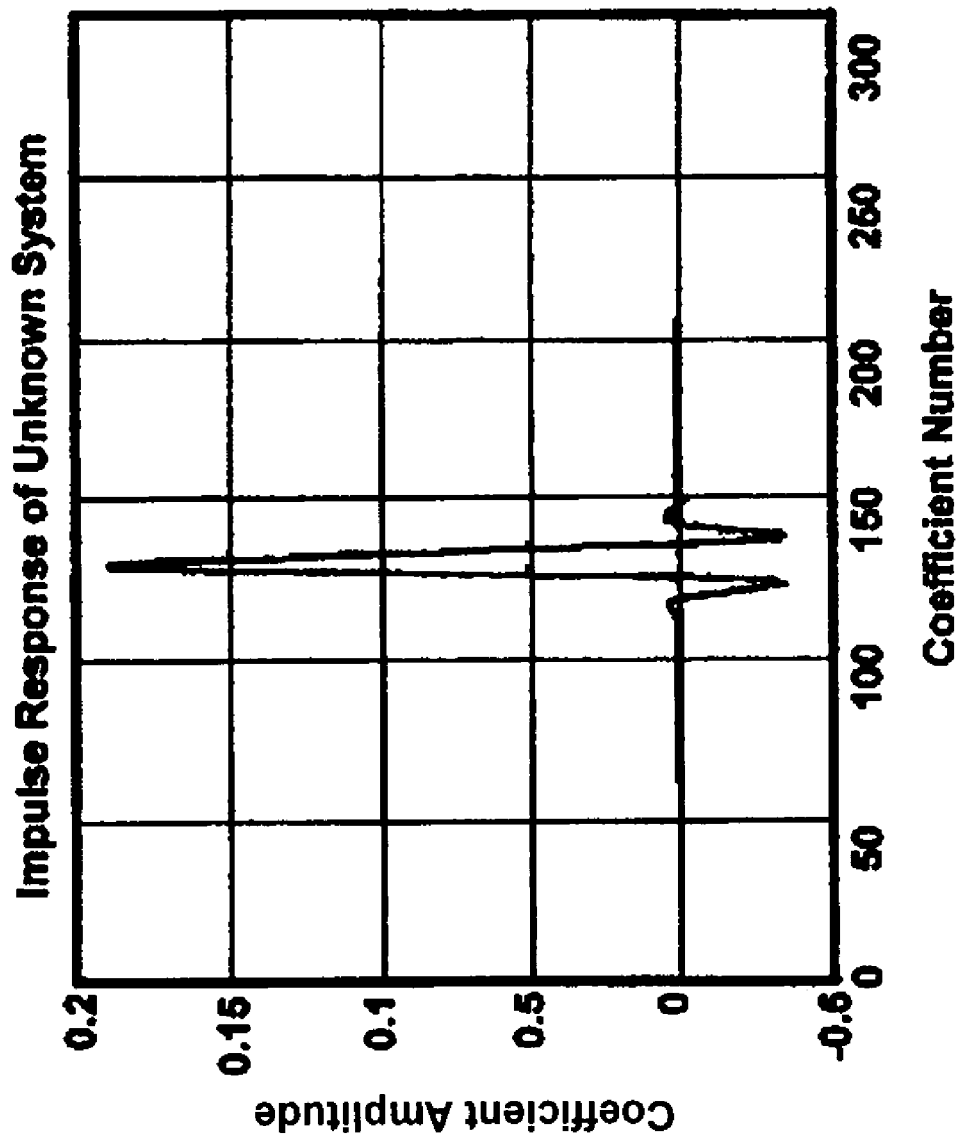
FIG. 3 is a diagram showing the impulse response for an unknown system.

In this example, the unknown system 11 was modeled as a low-pass function with a power spectral density as shown in FIG. 2 and an impulse response as shown in FIG. 3. A 256-coefficient adaptive filter, having a specified limit of $$\sum_{i=1}^{N} \mu_i = 256$$

instead of the traditional limits, was allowed to converge using a constant, uniform update gain of 1 and two non-uniform update gains. The non-uniform update gains were a constant value for active coefficients of the adaptive filter and a value of substantially zero for the non-active coefficients of the adaptive filter. The values used for the non-uniform update gains were 1 and 7.

Figure 4:
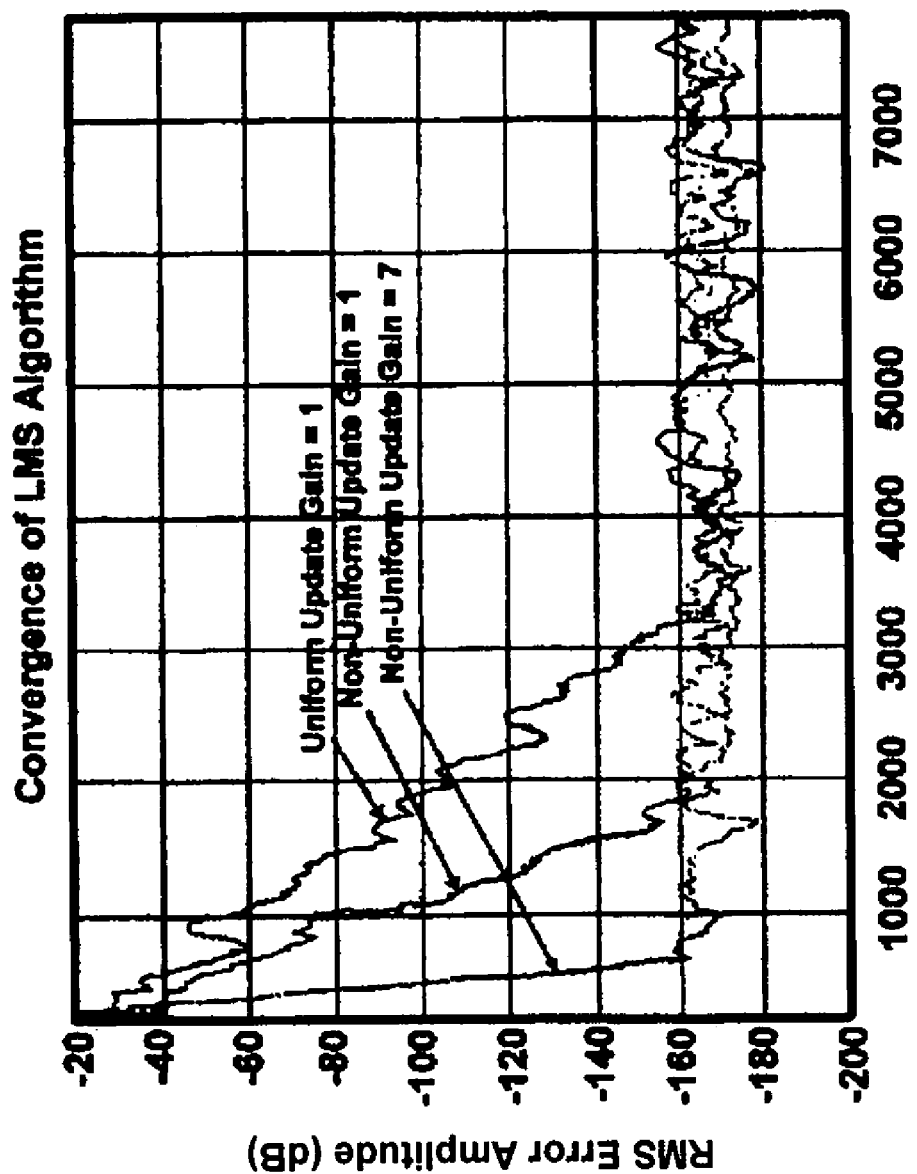
FIG. 4 is a diagram showing a performance comparison of an adaptive filter with various gain configurations.

FIG. 4 is a diagram showing comparative convergences of the adaptive filter using these three update gain parameters. As shown therein, the algorithm using an update gain of 7, which is very much higher than the accepted upper bound, converged substantially faster than the algorithm employing the other two update gains. Also as shown therein, the algorithm remained stable throughout the convergence process at the higher update gain.

Figure 5:
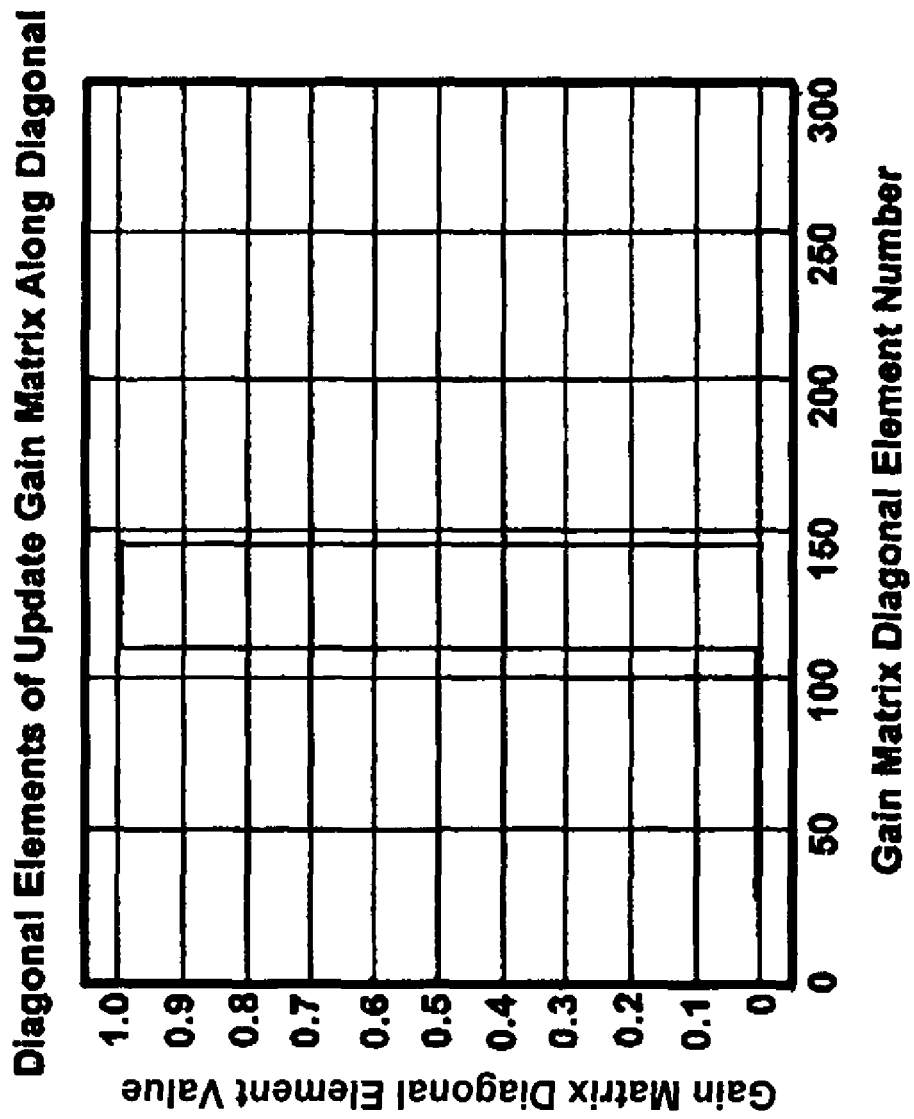
FIG. 5 is a diagram of a rudimentary gain configuration for an adaptive filter.
Figure 6:
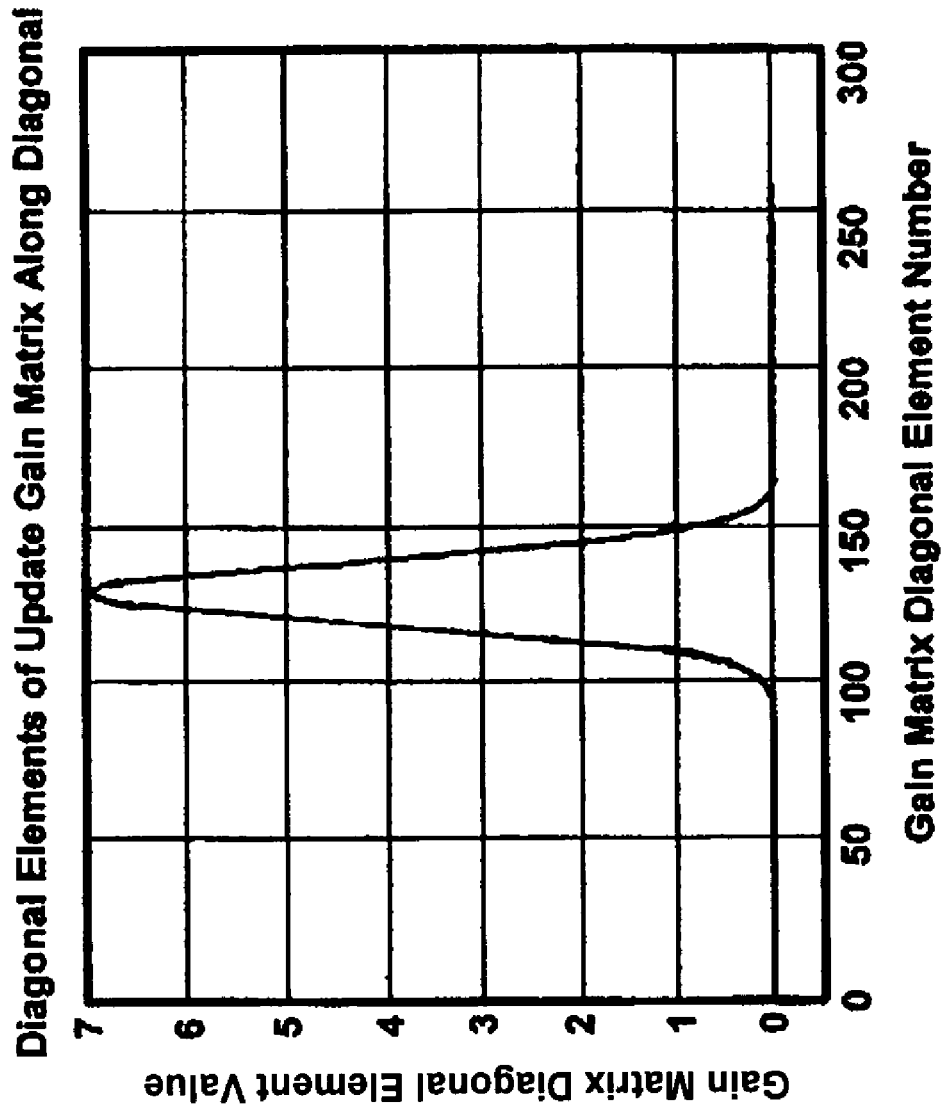
FIG. 6 is a diagram showing a Gaussian gain configuration.

Two examples of the update gain matrix elements, $\mu_1$ to $\mu_N$, are shown in FIGS. 5 and 6. FIG. 5 shows update gain matrix elements that have the value zero for all but the active coefficients. The active coefficients need not be limited to 1 and can attain any value consistent with the stated limit $$\sum_{i=1}^{N} \mu_i = 256.$$

FIG. 6 shows update gain matrix elements that are the result of the equation $$\mu_i = \frac{1}{\sigma\sqrt{2\pi}} \varepsilon^{\frac{(x_i-x)^2}{2\sigma^2}}$$

(the form for Gaussian probability density). However, any configuration of update gain can be used that conforms to the limitation regarding the number of coefficients as stated above.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

What is claimed is:

1. An adaptive filtering method comprising the steps of:
computing a difference between an adaptive filter output signal of an adaptive filter having a plurality of filter coefficients and an unknown system output signal, said difference constituting an error signal; and
adjusting said filter coefficients using a normalized time domain LMS algorithm employing an update gain greater than $$\frac{2}{\lambda_{max}} \text{ or } \frac{2}{3\,tr[R]}$$

so as to reduce said error signal.

2. A method in accordance with claim 1, wherein said update gain is non-uniform.

3. A method in accordance with claim 1, wherein a portion of said plurality of filter coefficients are active filter coefficients and a portion of said plurality of filter coefficients are non-active filter coefficients.

4. A method in accordance with claim 3, wherein said update gain increases for said active coefficients during convergence of said normalized LMS algorithm.

5. A method in accordance with claim 4, wherein said non-active coefficients are substantially zero.

6. A normalized least mean square adaptive filter comprising:
means for filtering an input signal by an adaptive filter weight;
means for comparing the filtered input signal and a reference signal to provide an error signal;
means for feeding said error signal back to said filtering means for adaptively adjusting said filter weight as a function of said error signal and a feedback coefficient; and
means for determining said feedback coefficient in accordance with the relationship $$h(x+1)=h(k)+\mu e(k)x(k)$$

where $\mu$ is an update gain greater than $$\frac{2}{\lambda_{max}} \text{ or } \frac{2}{3\,tr[R]}.$$

* * * * *